United States Patent
Yamamoto et al.

(10) Patent No.: US 9,163,309 B2
(45) Date of Patent: Oct. 20, 2015

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Tetsuo Yamamoto, Toyama (JP); Kazuhiro Morimitsu, Toyama (JP); Kazuyuki Toyoda, Toyama (JP); Kenji Ono, Toyama (JP); Tadashi Takasaki, Toyama (JP); Ikuo Hirose, Toyama (JP); Takafumi Sasaki, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/498,023

(22) Filed: Sep. 26, 2014

(65) Prior Publication Data
US 2015/0093916 A1    Apr. 2, 2015

(30) Foreign Application Priority Data
Sep. 30, 2013    (JP) .................................. 2013-204731

(51) Int. Cl.
| | | |
|---|---|---|
| *C23C 16/00* | (2006.01) | |
| *C23C 16/455* | (2006.01) | |
| *C23C 16/52* | (2006.01) | |
| *C23C 16/44* | (2006.01) | |
| *H01L 21/02* | (2006.01) | |

(52) U.S. Cl.
CPC ............ *C23C 16/455* (2013.01); *C23C 16/4408* (2013.01); *C23C 16/4412* (2013.01); *C23C 16/52* (2013.01); *H01L 21/02271* (2013.01)

(58) Field of Classification Search
CPC   C23C 16/4408; C23C 16/4412; C23C 16/52; C23C 16/44; H01L 21/022715
See application file for complete search history.

(56) References Cited

U.S. PATENT DOCUMENTS 6,162,323 A * 12/2000 Koshimizu ............... 156/345.26
7,594,479 B2 * 9/2009 Yonezawa et al. ........ 118/723 E

* cited by examiner

*Primary Examiner* — Richard Booth
(74) *Attorney, Agent, or Firm* — Edell, Shapiro & Finnan LLC

(57) ABSTRACT

Generation of byproducts is inhibited in a buffer space even in a single-wafer-type apparatus using the buffer space. A method of manufacturing a semiconductor device includes (a) loading a substrate into a process chamber; (b) supplying a first-element-containing gas via a buffer chamber of a shower head to the substrate placed in the process chamber; (c) supplying a second-element-containing gas to the substrate via the buffer chamber; and (d) performing an exhaust process between (b) and (c), wherein (d) includes: exhausting an atmosphere of the buffer chamber; and exhausting an atmosphere of the process chamber after exhausting the atmosphere of the buffer chamber.

17 Claims, 5 Drawing Sheets

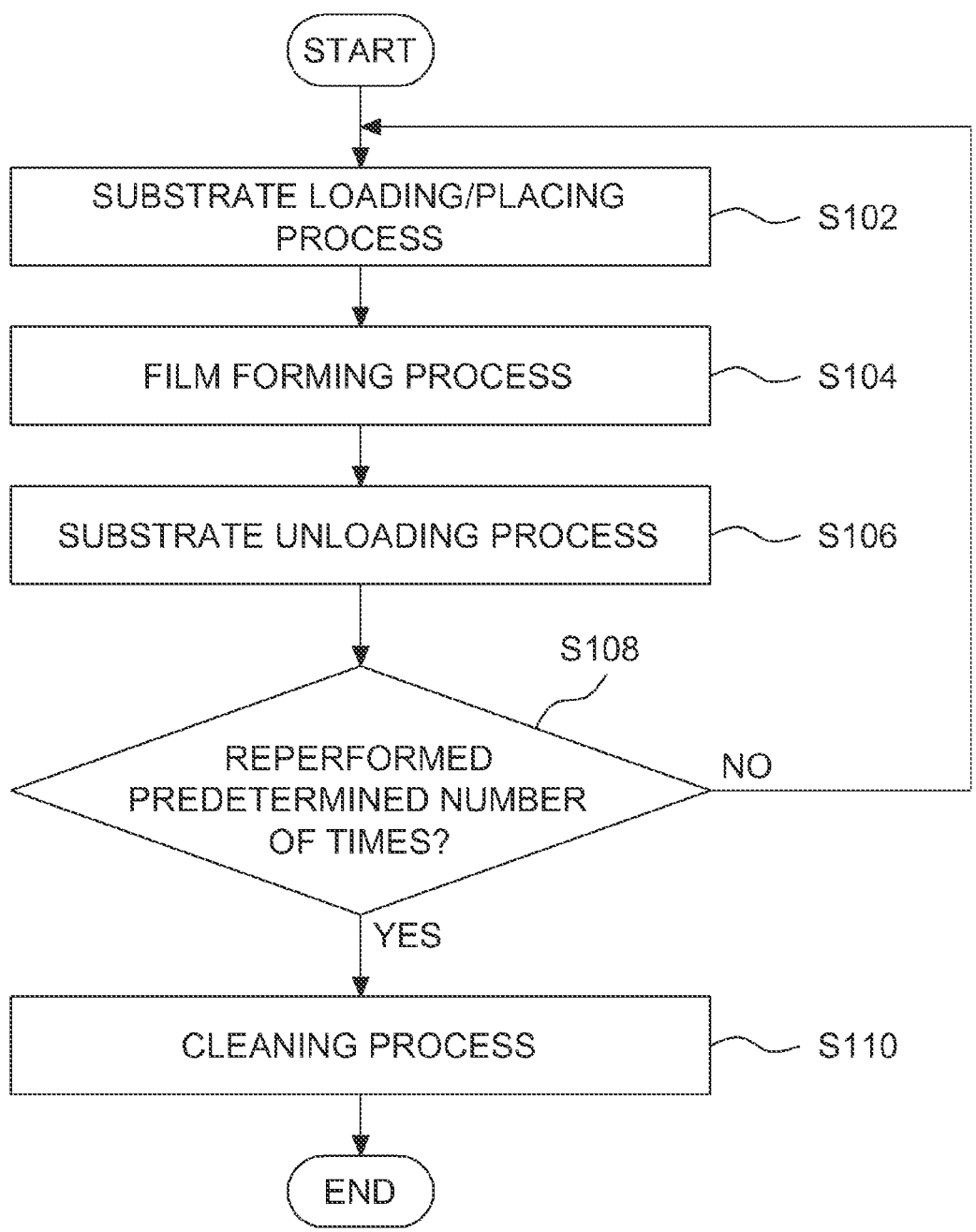

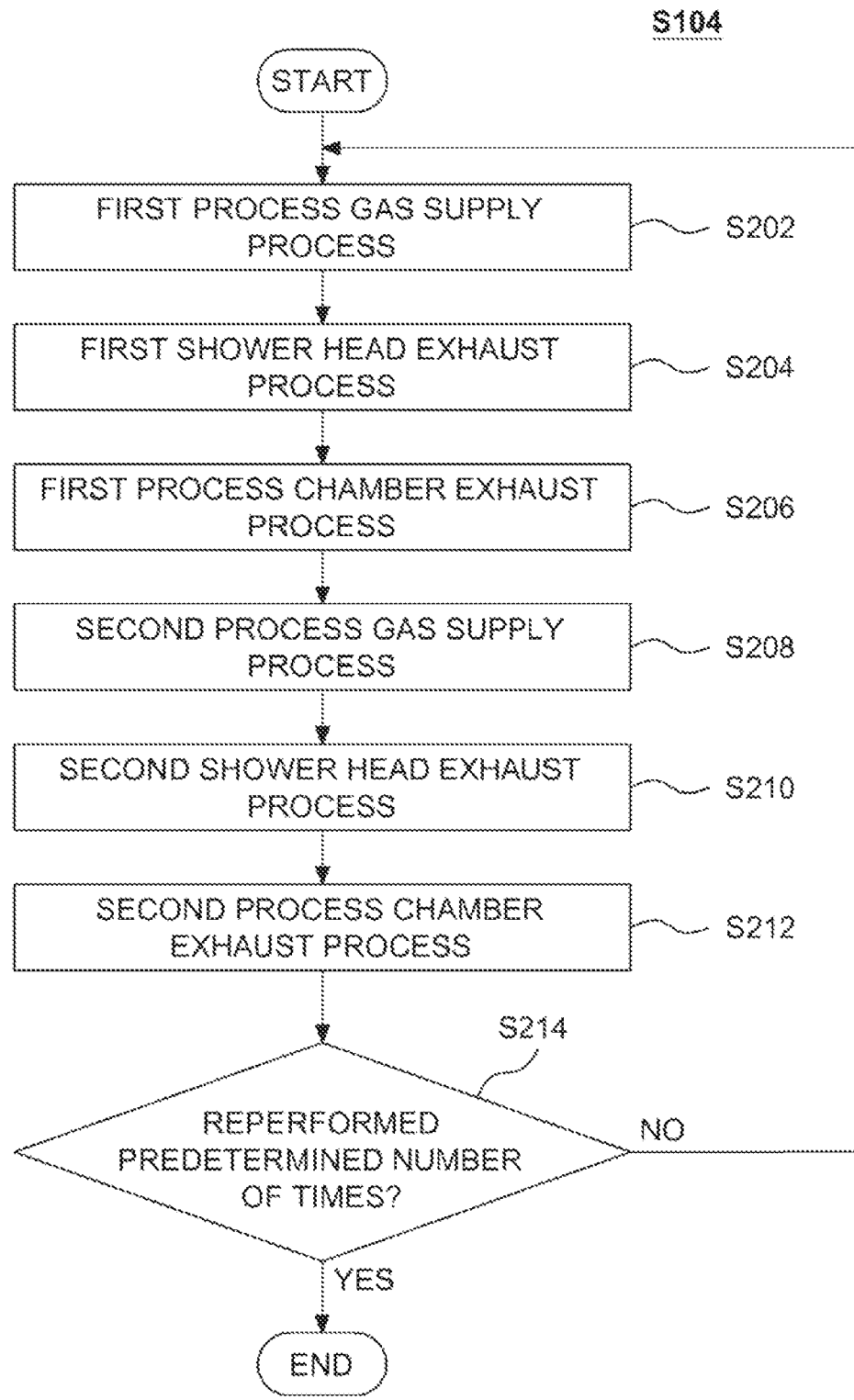

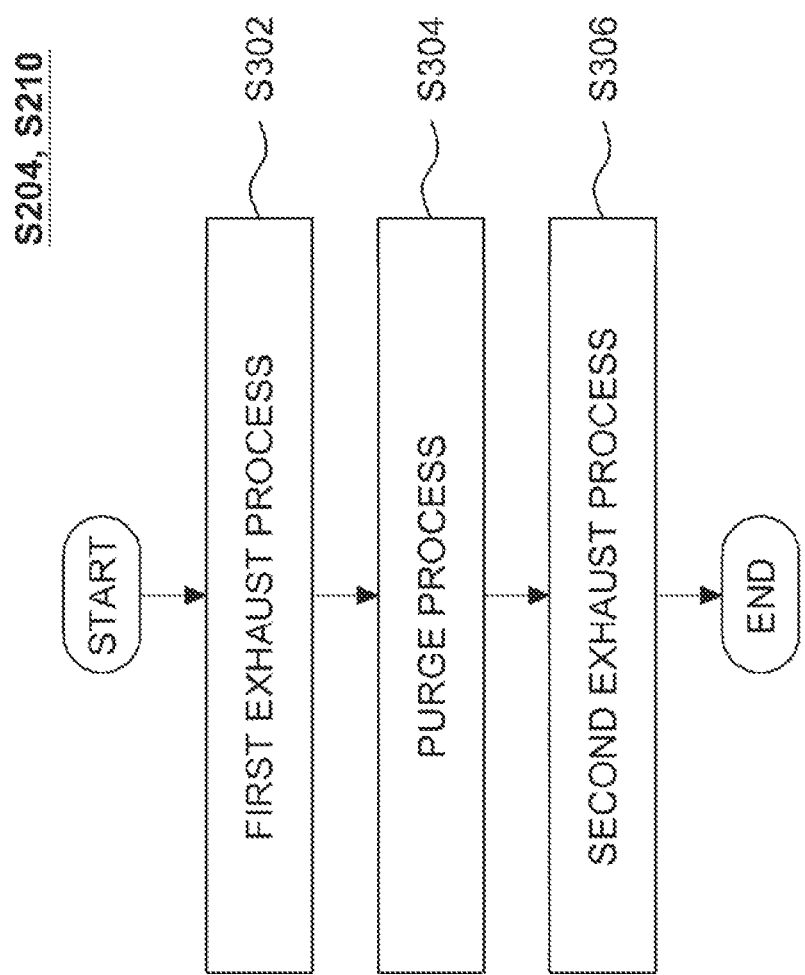

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This application claims foreign priority under 35 U.S.C. §119(a)-(d) to Application No. JP 2013-204731 filed on Sep. 30, 2013, entitled "Substrate Processing Apparatus, Method of Manufacturing Semiconductor Device and Non-Transitory Computer-Readable Recording Medium," the entire contents of which are hereby incorporated by reference.

FIELD OF THE INVENTION

The present invention relates to a substrate processing apparatus, a method of manufacturing a semiconductor device and a non-transitory computer-readable recording medium.

BACKGROUND

In recent years, semiconductor devices, such as flash memories, are showing a tendency to become highly integrated. Thus, a pattern size is being markedly being downscaled. When patterns are formed, a predetermined processing process, such as an oxidation process, a nitridation process, etc., may be performed on a substrate as one process of a manufacturing process.

As a method of forming the patterns, a groove is formed between circuits, and a liner film or a line is formed within the groove. With recent miniaturization, the groove is formed to obtain a high aspect ratio.

To form the liner film, it is necessary to form a film having good step coverage, which has no variation in film thickness even in an upper side surface, a middle side surface, a lower side surface and a lower portion of the groove. Due to the film having the good step coverage, a semiconductor device may have uniform characteristics between grooves, and a variation in the characteristics of the semiconductor device may be inhibited.

A process of processing the groove having a high aspect ratio by heating a gas or using a plasma-state gas has been attempted. However, it is difficult to form a film having good step coverage.

As methods of forming the film, there are a chemical vapor deposition (CVD) method and an atomic layer deposition (ALD) method in which films are formed by causing a reaction of at least two types of process gases with one another.

Since it is necessary to make uniform the characteristics of the semiconductor device, gases need to be uniformly supplied to an in-plane surface of a substrate during formation of a thin film. Thus, a single-wafer-type apparatus capable of uniformly supplying gases to a processed surface of a substrate has been developed. In the single-wafer-type apparatus, for example, a shower head including a buffer chamber is installed on the substrate to supply gases more uniformly.

To form a film using a single-wafer-type apparatus, at least two types of gases are used. The film is formed by allowing at least two types of gases to react with one another above a substrate or on the surface of the substrate. However, since the gases are supplied via the buffer chamber, byproducts may be generated in the buffer chamber due to a reaction between the gases in the buffer chamber. The generated byproducts may adversely affect characteristics of the substrate.

SUMMARY

Therefore, it is a main object of the present invention to provide a substrate processing apparatus, a method of manufacturing a semiconductor device and a non-transitory computer-readable recording medium, which may inhibit generation of byproducts in a buffer space even in a single-wafer-type apparatus using the buffer space.

According to one aspect of the present invention, there is provided a method of manufacturing a semiconductor device. The method includes: (a) loading a substrate into a process chamber; (b) supplying a first-element-containing gas via a buffer chamber of a shower head to the substrate placed in the process chamber; (c) supplying a second-element-containing gas to the substrate via the buffer chamber; and (d) performing an exhaust process between the steps (b) and (c), wherein the step (d) includes: exhausting an atmosphere of the buffer chamber; and exhausting an atmosphere of the process chamber after exhausting the atmosphere of the buffer chamber.

According to another aspect of the present invention, there is provided a substrate processing apparatus including: a process chamber configured to process a substrate; a shower head including a buffer chamber; a first exhaust system configured to exhaust an atmosphere of the buffer chamber; a first-element-containing gas supply system configured to supply a first-element-containing gas to the substrate via the buffer chamber; a second-element-containing gas supply system configured to supply a second-element-containing gas to the substrate via the buffer chamber; a second exhaust system configured to exhaust an atmosphere of the process chamber; and a control unit configured to control the first exhaust system, the first-element-containing gas supply system, the second-element-containing gas supply system and the second exhaust system to perform: (a) loading the substrate into the process chamber; (b) supplying the first-element-containing gas via the buffer chamber of the shower head to the substrate placed in the process chamber; (c) supplying the second-element-containing gas to the substrate via the buffer chamber; and (d) performing an exhaust process between the step (b) and the step (c), the step (d) including a buffer chamber exhaust process of exhausting the atmosphere of the buffer chamber using the first exhaust system and a process chamber exhaust process of exhausting the atmosphere of the process chamber using the second exhaust system after the buffer chamber exhaust process.

BRIEF DESCRIPTION OF THE DRAWINGS

FIG. 3 is a flowchart illustrating a substrate processing process according to a first embodiment of the present invention.

FIG. 4 is a flowchart illustrating a film forming process according to the first embodiment of the present invention.

FIG. 5 is a diagram illustrating a process of exhausting an atmosphere of a shower head according to the first exemplary embodiment of the present invention.

DETAILED DESCRIPTION

First Embodiment of the Present Invention

A substrate processing apparatus according to a first embodiment of the present invention will now be described with reference to FIGS. 1 through 3.

One embodiment of the present invention will now be described with reference to the accompanying drawings.

(1) Structure of Substrate Processing Apparatus

Figure 1:
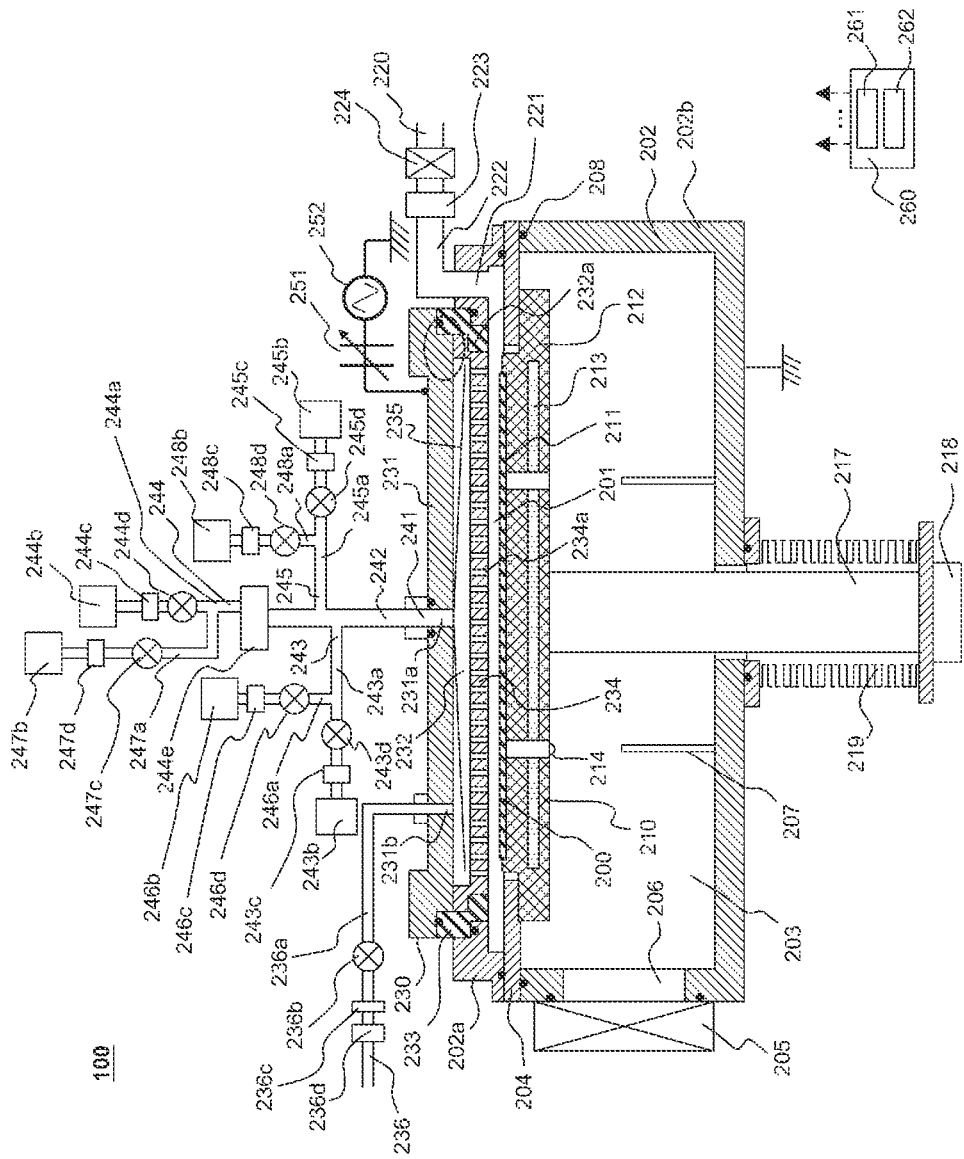
FIG. 1 is a cross-sectional view of a substrate processing apparatus according to an exemplary embodiment of the present invention.
Figure 2:
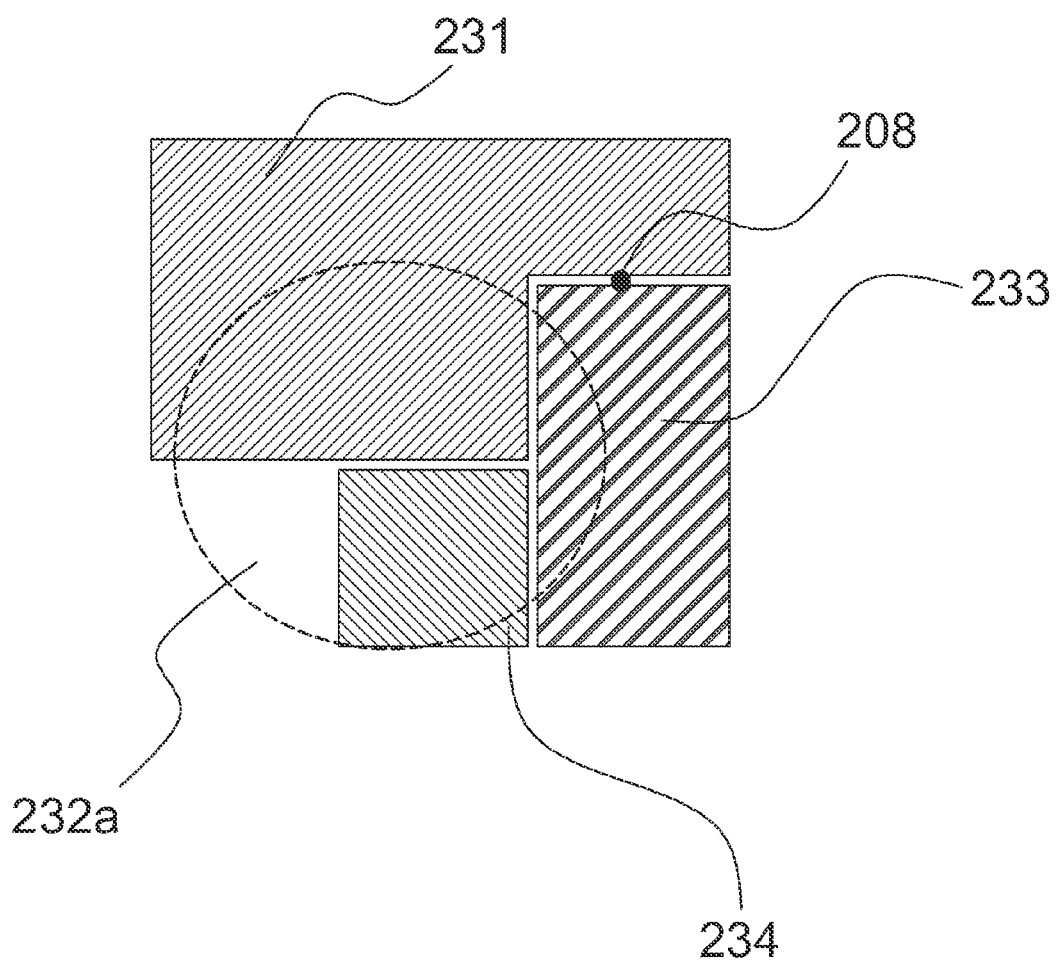
FIG. 2 is a diagram illustrating a stay region 232a of a substrate processing apparatus according to an exemplary embodiment of the present invention.

FIG. 1 is a cross-sectional view of a substrate processing apparatus 100 according to the present embodiment. The substrate processing apparatus 100 is an apparatus for forming thin films and configured as a single-wafer-type substrate processing apparatus as shown in FIG. 1.

As illustrated in FIG. 1, the substrate processing apparatus 100 includes a process container 202. The process container 202 is configured as, for example, a planar airtight container having a circular cross-section. Also, a sidewall or a bottom wall of the process container 202 is formed of a metal material, for example, aluminum (Al) or stainless steel (SUS).

The process container 202 includes an upper container 202a, a lower container 202b and a shower head 230 serving as a ceiling unit. A partition plate 204 is installed between the upper container 202a and the lower container 202b.

A space that is surrounded by the upper process container 202a and a lower end of the shower head 230 above the partition plate 204 will be referred to as a process space. A space that is surrounded by the lower container 202b below the partition plate 204 will be referred to as a transfer space. A constitutional element that is configured by the upper process container 202a and the lower end of the shower head 230 and surrounds the process space will be referred to as a process chamber 201. Also, a constitutional element that surrounds the transfer space will be referred to as a transfer chamber 203 in the process chamber 201. An O-ring 208 for air-tightly closing the process container 202 is installed between the constitutional elements.

A substrate loading/unloading port 206 is installed in a side surface of the lower container 202b and adjacent to a gate valve 205, and a wafer 200 is transferred between the lower container 202b and a transfer chamber (not shown) via the substrate loading/unloading port 206. A plurality of lift pins 207 are installed on a bottom portion of the lower container 202b. Also, the lower container 202b is grounded.

A substrate support unit 210 for supporting the wafer 200 is installed in the process chamber 201. The substrate support unit 210 mainly includes a substrate placing surface 211 for placing the wafer 200, a substrate placing table 212 having the substrate placing surface 211 disposed on a surface thereof, and a heater 213 embedded in the substrate placing table 212 and serving as a heating source. Through holes 214 through which the lift pins 207 pass are respectively installed in positions corresponding to the lift pins 207.

The substrate placing table 212 is supported by a shaft 217. The shaft 217 penetrates a bottom portion of the process container 202 and is connected to an elevating mechanism 218 outside the process container 202. By moving the shaft 217 and the substrate placing table 212 upward/downward by operating the elevating mechanism 218, the wafer 200 placed on the substrate placing surface 211 may be moved upward/downward. Also, the circumference of a lower end portion of the shaft 217 is coated with a bellows 219, and the inside of the process container 202 is air-tightly retained.

The substrate placing table 212 is moved downward to a substrate support table during the transfer of the wafer 200 until the substrate placing surface 211 is in a position (wafer transfer position) of the substrate loading/unloading port 206. During the processing of the wafer 200, the substrate placing table 212 is moved upward until the wafer 200 is in a process position (wafer process position) of the process chamber 201 as shown in FIG. 1.

Specifically, when the substrate placing table 212 is moved downward to the wafer transfer position, upper end portions of the lift pins 207 protrude from a top surface of the substrate placing surface 211 so that the lift pins 207 can support the wafer 200 from below. Also, when the substrate placing table 212 is moved upward to the wafer process position, the lift pins 207 are buried from top surface of the substrate placing surface 211 so that the substrate placing surface 211 can support the wafer 200 from below. Also, since the lift pins 207 are in direct contact with the wafer 200, the lift pins 207 are preferably formed of a material, for example, quartz or alumina.

Gas Introduction Port

A gas introduction port 241 for supplying various gases into the process chamber 201 is installed in a top surface (ceiling wall) of a shower head 230 to be described below installed over the process chamber 201. A structure of a gas supply system connected to the gas introduction port 241 will be described below.

Shower Head

The shower head 230 is installed between the gas introduction port 241 and the process chamber 201 and serves as a gas dispersion mechanism which communicates with the process chamber 201. The gas introduction port 241 is connected to a lid 231 of the shower head 230. Gases introduced through the gas introduction port 241 are supplied to a buffer chamber 232 of the shower head 230 via a hole 231a installed in the lid 231. The buffer chamber 232 is configured by the lid 231 and a dispersion plate 234 to be described below.

The lid 231 of the shower head 230 is formed of a conductive metal and used as an electrode for generating plasma in the buffer chamber 232 or in the process chamber 201. An insulating block 233 is installed between the lid 231 and the upper container 202a and electrically insulates the lid 231 from the upper container 202a.

The shower head 230 includes the dispersion plate 234 for dispersing gases introduced through the gas introduction port 241 between a buffer space and the process space of the process chamber 201. A plurality of through holes 234a are installed in the dispersion plate 234. The dispersion plate 234 is disposed opposite to the substrate placing surface 211. The dispersion plate 234 includes a convex portion in which the through holes 234a are installed, and a flange portion installed around the convex portion. The flange portion is supported by the insulating block 233.

A gas guide 235 for forming the flow of supplied gases is installed in the buffer chamber 232. The gas guide 235 has a circular conic shape having the hole 231a as an apex, and the diameter of the gas guide 235 increases toward the dispersion plate 234. The diameter of a lower end of the gas guide 235, which is obtained in a horizontal direction, is formed further outward from an outermost circumference of a group of the through holes 234a.

An exhaust pipe 236a is connected to an upper portion of the buffer chamber 232 via an shower-head exhaust hole 231b. A valve 236b for turning on and off an exhaust operation, a pressure adjustor 236c (e.g., an auto pressure controller (APC)) for controlling the inside of the buffer chamber 232 to a predetermined pressure, and a vacuum pump 236d are sequentially connected in series to the exhaust pipe 236a.

Since the shower-head exhaust hole 231b is disposed above the gas guide 235, the flow of gases is formed as described below in a shower head exhaust process to be described below. An inert gas supplied through the hole 231a is dispersed by the gas guide 235 and flows toward central and lower portions of a space of the buffer chamber 232. Thereafter, the inert gas turns at an end portion of the gas guide 235 and is exhausted through the shower-head exhaust hole 231b. Also, a first exhaust system 236 is configured by at least the exhaust pipe 236a, the valve 236b and the pressure adjustor 236c.

Supply System

A common gas supply pipe 242 is connected to the gas introduction port 241 connected to the lid 231 of the shower head 230. A first gas supply pipe 243a, a second gas supply pipe 244a and a third gas supply pipe 245a are connected to the common gas supply pipe 242. The second gas supply pipe 244a is connected to the common gas supply pipe 242 via a remote plasma unit 244e.

A first-element-containing gas is mainly supplied through a first gas supply system 243 including the first gas supply pipe 243a, and a second-element-containing gas is mainly supplied through a second gas supply system 244 including the second gas supply pipe 244a. An inert gas is mainly supplied when the wafer 200 is processed using a third gas supply system 245 including the third gas supply pipe 245a, and a cleaning gas is mainly supplied when the process chamber 201 is cleaned.

First Gas Supply System

A first gas supply source 243b, a mass flow controller (MFC) 243c which is a flow rate control device (flow rate control unit), and a valve 243d which is an opening/closing valve are sequentially installed at the first gas supply pipe 243a in an upstream direction.

Gas containing a first element (hereinafter, [first-element-containing gas]) is supplied through the first gas supply pipe 243a via the valve 243d, the common gas supply pipe 242 and the shower head 230 [buffer chamber 232] into the process chamber 201.

The first-element-containing gas is a source gas, i.e., one of process gases. Here, the first element is, for example, silicon (Si). That is, the first-element-containing gas is, for example, a silicon-containing gas. For example, bis(tertiary-butyl-amino)silane (SiH2[NH(C4H9)]2, abbreviated as BTBAS) gas may be used as the silicon-containing gas. Also, the first-element-containing gas may be any one of a solid, a liquid and a gas at normal temperature and pressure. When the first-element-containing gas is a liquid at normal temperature and pressure, a vaporizer (not shown) may be installed between a first gas supply source 232b and the MFC 243c. Here, an example in which the first-element-containing gas is a gas will be described.

In addition to BTBAS gas, an organic silicon material gas, such as hexamethyldisilazane (C6H19NSi2, abbreviated as HMDS) gas or trisilylamine [(SiH3)3N, abbreviated as TSA] gas, may be used as the silicon-containing gas. These gases may function as precursors.

A downstream end of a first inert gas supply pipe 246a is connected to the first gas supply pipe 243a at a downstream side of the valve 243d. An inert gas supply source 246b, an MFC 246c which is a flow rate control device (flow rate control unit), and a valve 246d which is an opening/closing valve are sequentially installed at the first inert gas supply pipe 246a in an upstream direction.

Here, an inert gas is, for example, nitrogen (N2) gas. As the inert gas, not only N2 gas but also a rare gas, such as helium (He) gas, neon (Ne) gas, argon (Ar) gas, etc., may be used.

The inert gas is supplied through the first inert gas supply pipe 246a via the MFC 246c, the valve 246d and the first gas supply pipe 243a into the shower head 230 [buffer chamber 232] and the process chamber 201. The inert gas acts as a carrier gas or a dilution gas in a thin film forming process S104 to be described below.

A first-element-containing gas supply system 243 (which is also referred to as a silicon-containing gas supply system) is mainly configured by the first gas supply pipe 243a, the MFC 243c and the valve 243d.

A first inert gas supply system is mainly configured by the first inert gas supply pipe 246a, the MFC 246c and the valve 246d. Also, the inert gas supply source 246b and the first gas supply pipe 243a may be included in the first inert gas supply system.

In addition, the first gas supply source 243b and the first inert gas supply system may be included in the first-element-containing gas supply system.

Second Gas Supply System

The remote plasma unit 244e is installed at a downstream side of the second gas supply pipe 244a. A second gas supply source 244b, an MFC 244c which is a flow rate control device (flow rate control unit), and a valve 244d which is an opening/closing valve are sequentially installed at an upstream side of the second gas supply pipe 244a in an upstream direction.

Gas containing a second element (hereinafter, [second-element-containing gas]) is supplied through the second gas supply pipe 244a via the MFC 244c, the valve 244d, the remote plasma unit 244e, the common gas supply pipe 242 and the shower head 230 [buffer chamber 232] into the process chamber 201. The second-element-containing gas is processed by the remote plasma unit 244e to generate plasma, and the plasma is irradiated onto the wafer 200.

The second-element-containing gas is one of process gases. Also, the second-element-containing gas may be a reactive gas or a modification gas.

Here, the second-element-containing gas contains the second element different from the first element. The second element is, for example, any one of oxygen (O), nitrogen (N) and carbon (C). In the present embodiment, the second-element-containing gas is, for example, an oxygen-containing gas. Specifically, oxygen (O2) gas is used as the oxygen-containing gas.

A second-element-containing gas supply system 244 (which is also referred to as an oxygen-containing gas supply system) is mainly configured by the second gas supply pipe 244a, the MFC 244c and the valve 244d.

A downstream end of a second inert gas supply pipe 247a is connected to the second gas supply pipe 244a at a downstream side of the valve 244d. An inert gas supply source 247b, an MFC 247c which is a flow rate control device (flow rate control unit), and a valve 247d which is an opening/closing valve are sequentially installed at the second inert gas supply pipe 247a in an upstream direction.

An inert gas is supplied through the second inert gas supply pipe 247a via the MFC 247c, the valve 247d, the second gas supply pipe 244a and the remote plasma unit 244e into the shower head 230 [buffer chamber 232] and the process chamber 201. An inert gas acts as a carrier gas or a dilution gas in the thin film forming process S104 to be described below.

A second inert gas supply system is mainly configured by the second inert gas supply pipe 247a, the MFC 247c and the valve 247d. Also, the inert gas supply source 247b, the second gas supply pipe 244a and the remote plasma unit 244e may be included in the second inert gas supply system.

In addition, the second gas supply source 244b, the remote plasma unit 244e and the second inert gas supply system may be included in the second-element-containing gas supply system 244.

Third Gas Supply System

A third gas supply source 245b, an MFC 245c which is a flow rate control device (flow rate control unit), and a valve 245d which is an opening/closing valve are sequentially installed at the third gas supply pipe 245a in an upstream direction.

An inert gas serving as a purge gas is supplied through the third gas supply pipe 245a via the MFC 245c, the valve 245d and the common gas supply pipe 242 into the shower head 230 and the process chamber 201.

Here, the inert gas is, for example, nitrogen (N2) gas. As the inert gas, not only N2 gas but also a rare gas, such as He gas, Ne gas, Ar gas, etc., may be used.

An inert gas supply source as the third gas supply source 245b, the MFC 245c which is a flow rate control device (flow rate control unit), and the valve 245d which is an opening/closing valve are sequentially installed at the third gas supply pipe 245a in an upstream direction.

A downstream end of a cleaning gas supply pipe 248a is connected to the third gas supply pipe 245a at a downstream side of the valve 245d. A cleaning gas supply source 248b, an MFC 248c which is a flow rate control device (flow rate control unit), and a valve 248d which is an opening/closing valve are sequentially installed at the cleaning gas supply pipe 248a in an upstream direction.

A third gas supply system 245 is mainly configured by the third gas supply pipe 245a, the MFC 245c and the valve 245d.

A cleaning gas supply system is mainly configured by the cleaning gas supply pipe 248a, the MFC 248c and the valve 248d. Also, the cleaning gas supply source 248b and the third gas supply pipe 245a may be included in the cleaning gas supply system.

In addition, the third gas supply source 245b and the cleaning gas supply system may be included in the third gas supply system 245.

In a substrate processing process, an inert gas is supplied through the third gas supply pipe 245a via the MFC 245c, the valve 245d and the common gas supply pipe 242 into the shower head 230 [buffer chamber 232] and the process chamber 201. Also, in a cleaning process, a cleaning gas is supplied via the MFC 248c, the valve 248d and the common gas supply pipe 242 into the shower head 230 [buffer chamber 232] and the process chamber 201.

An inert gas supplied from the inert gas supply source 245b acts as a purge gas for purging gases remaining in the process chamber 201 or the shower head 230 in the thin film forming process S104 to be described below. Also, the inert gas may act as a carrier gas or dilution gas of the cleaning gas in the cleaning process.

The cleaning gas supplied from the cleaning gas supply source 248b acts as a cleaning gas for removing byproducts adhered to the process chamber 201 using the shower head 230.

Here, the cleaning gas is, for example, nitrogen trifluoride (NF3) gas. Also, for example, a combination of hydrogen fluoride (HF) gas, chlorine trifluoride (ClF3) gas and fluorine (F2) gas may be used as the cleaning gas.

Second Exhaust System

An exhaust port 221 for exhausting an atmosphere of the process chamber 201 is installed in a side surface of an inner wall of the process chamber 201 [upper container 202a]. An exhaust pipe 222 is connected to the exhaust port 221, and a pressure adjustor 223 (e.g., an auto pressure controller (APC)) for controlling the inside of the process chamber 201 to a predetermined pressure and a vacuum pump 224 are sequentially connected in series to the exhaust pipe 222. A second exhaust system 220 (exhaust line) is mainly configured by the exhaust port 221, the exhaust pipe 222, the pressure adjustor 223 and the vacuum pump 224.

Plasma Generation Unit

A matcher 251 and a radio-frequency (RF) power source 252 are connected to the lid 231 of the shower head 230. By adjusting an impedance using the RF power source 252 and the matcher 251, plasma is generated in the shower head 230 and the process chamber 201.

Controller

The substrate processing apparatus 100 includes a controller 260 for controlling operations of each of constitutional elements of the substrate processing apparatus 100. The controller 260 includes at least an operation unit 261 and a memory unit 262. The controller 260 calls a program or control recipe of the substrate processing apparatus 100 from the memory unit 262 in response to an instruction from the controller 260 or a user and controls each of the constitutional elements according to the contents of the program or the control recipe.

(2) Substrate Processing Process

Next, a process of forming a thin film on the wafer 200 using the substrate processing apparatus 100 as the substrate processing apparatus 100 will be described with reference to FIGS. 3, 4 and 5. FIG. 3 is a flowchart illustrating a substrate processing process according to the present embodiment. FIG. 4 is a detailed flowchart illustrating a film forming process of FIG. 3. FIG. 5 is a flowchart illustrating a process of exhausting an atmosphere of a shower head as shown in FIG. 4. In the following description, an operation of each of constitutional elements of the substrate processing apparatus 100 is controlled by the controller 260.

The substrate processing process will now be schematically described with reference to FIGS. 3, 4 and 5.

Here, an example in which a silicon oxide film is formed as a thin film on the wafer 200 using BTBAS gas as the first-element-containing gas and using oxygen (O2) gas as the second-element-containing gas will be described. For example, a predetermined film may be formed on the wafer 200. Also, a predetermined pattern may be previously formed on the wafer 200 or the predetermined film.

Substrate Loading/Placing Process S102

In the substrate processing apparatus 100, the lift pins 207 penetrate the through holes 214 of the substrate placing table 212 by moving the substrate placing table 212 downward to the transfer position of the wafer 200. As a result, the lift pins 207 protrude only a predetermined height from the surface of the substrate placing table 212. Subsequently, the gate valve 205 is opened, the wafer 200 (processed substrate) is loaded into the process chamber 201 using a wafer carrier (not shown), and the wafer 200 is carried onto the lift pins 207. Thus, the wafer 200 is supported in a horizontal posture on the lift pins 207 protruding from the surface of the substrate placing table 212.

When the wafer 200 is loaded into the process container 202, the wafer carrier escapes from the process container 202, and the gate valve 205 is closed to air-tightly close the inside of the process container 202. Thereafter, the wafer 200 is placed on the substrate placing surface 211 installed on the substrate placing table 212 by moving the substrate placing table 212 upward.

When the wafer 200 is loaded into the process container 202, N2 gas which is an inert gas is preferably supplied by the inert gas supply system into the process container 202 while exhausting the inside of the process container 202 using the exhaust system. That is, while the inside of the process container 202 is being exhausted by opening the APC valve 223 by operating the vacuum pump (exhaust pump) 224, N2 gas is preferably supplied into the process container 202 by opening at least the valve 245d of the third gas supply system. Thus, intrusion of particles into the process container 202 or adhesion of particles onto the wafer 200 may be inhibited. Also, the vacuum pump (exhaust pump) 224 is always continuously operated at least after the substrate loading/placing process S102 has been performed and until a substrate unloading process S106 which will be described below ends.

When the wafer 200 is placed on the substrate placing table 212, power is supplied to the heater 213 buried in the substrate placing table 212 so that the surface of the wafer 200 can be set to a predetermined temperature. The temperature of the wafer 200 is set to be in the range of, for example, room temperature to a temperature of 500° C., and preferably a range of room temperature to a temperature of 400° C. In this case, the temperature of the heater 213 is adjusted by controlling an amount of current supplied to the heater 213 based on temperature information detected by a temperature sensor (not shown).

Film Forming Process S104

Next, the thin film forming process S104 is performed. A basic process flow of the thin film forming process S104 will be described, and features of the present embodiment will be described in detail below.

In the thin film forming process S104, BTBAS gas is supplied via the buffer chamber 232 of the shower head 230 into the process chamber 201. After a predetermined time has elapsed since the supply of the BTBAS gas, the supply of the BTBAS gas is stopped, and the BTBAS gas is exhausted from the buffer chamber 232 and the process chamber 201 using a purge gas.

After the BTBAS gas is exhausted, plasma-state oxygen gas is supplied into the process chamber 201 via the buffer chamber 232. The oxygen gas reacts with a silicon-containing film formed on the wafer 200 and forms a silicon oxide film. After a predetermined time has elapsed, the supply of the oxygen gas is stopped, and the oxygen gas is exhausted from the shower head 230 and the process chamber 201 using a purge gas.

In the film forming process S104, a silicon oxide film is formed to a desired thickness by repeating the process flow.

Substrate Unloading Process S106

Next, the wafer 200 is supported on the lift pins 207 protruding from the surface of the substrate placing table 212 by moving the substrate placing table 212 downward. Thereafter, the gate valve 205 is opened, and the wafer 200 is unloaded from the process container 202 using the wafer carrier. Thereafter, when the substrate processing process ends, the supply of an inert gas through the third gas supply system into the process container 202 is stopped.

Process Number Determining Process S108

After the substrate is unloaded, it is determined whether or not the number of times the thin film forming process was performed has reached a predetermined number of times. When it is determined that the number of times the thin film forming process was performed has reached the predetermined number of times, the substrate processing process enters into a cleaning process. When it is determined that the number of times the thin film forming process was performed has not reached the predetermined number of times, the substrate processing process enters into the substrate loading/placing process S102 to start processing the next wafer 200 which is on standby.

Cleaning Process S110

When it is determined that the number of times the thin film forming process was performed has reached the predetermined number of times in the process number determining process S108, a cleaning process is performed. Here, the valve 248d of the cleaning gas supply system is opened, and the cleaning gas is supplied via the shower head 230 into the process chamber 201.

When the shower head 230 and the process chamber 201 are filled with the cleaning gas, an impedance is adjusted by the matcher 251 while power is applied by the RF power source 252. Thus, plasma of the cleaning gas is generated in the shower head 230 and the process chamber 201. The generated plasma of the cleaning gas removes byproducts adhered to inner walls of the shower head 230 and the process chamber 201.

Next, the film forming process S104 will be described in detail with reference to FIG. 4.

First Process Gas Supply Process S202

When the wafer 200 placed on the substrate placing table 212 is heated to a desired temperature, the valve 243d is opened, and the supply of BTBAS which is a first process gas via the gas introduction port 241, the buffer chamber 232, and the plurality of through holes 234a into the process chamber 201 starts. The BTBAS gas is uniformly dispersed by the gas guide 235 in the buffer chamber 232. The uniformly dispersed gas is uniformly supplied via the plurality of through holes 234a onto the wafer 200 in the process chamber 201.

In this case, the MFC 243c is adjusted such that BTBAS gas has a predetermined flow rate. Also, a supply flow rate of BTBAS gas is in the range of, for example, 100 sccm to 5000 sccm. N2 gas may be supplied as a carrier gas through the first inert gas supply system along with BTBAS gas. By appropriately adjusting an opening degree of the APC valve 223 by operating the vacuum pump (exhaust pump) 224, an inner pressure of the process container 202 is set to be a predetermined pressure.

The supplied BTBAS gas is supplied onto the wafer 200. By putting BTBAS gas into contact with the wafer 200, a silicon-containing layer which is a first-element-containing layer is formed on the surface of the wafer 200.

The silicon-containing layer is formed to have a predetermined thickness and a predetermined distribution according to, for example, an inner pressure of the process container 202, a flow rate of BTBAS gas, a temperature of a susceptor and a process time of a first process region 201a.

After a predetermined time has elapsed, the valve 243d is closed, and the supply of BTBAS gas is stopped.

First Shower Head Exhaust Process S204

After the supply of BTBAS gas is stopped, the valve 236b is opened to exhaust the atmosphere of the shower head 230. Specifically, the atmosphere of the buffer chamber 232 is exhausted. In this case, the vacuum pump 236d is previously operated. The shower head exhaust process S204 will be described in detail below.

In this case, the valve 236b which is an opening/closing valve and the vacuum pump 236d are controlled such that an exhaust conductance in the buffer chamber 232 from the first exhaust system is set to be higher than a conductance of the exhaust pump 224 via the process chamber 201. Thus, the flow of gases from the center of the buffer chamber 232 toward the shower-head exhaust hole 231b is formed. As a result, gases adhered to the wall of the buffer chamber 232 or gases floating in the buffer space do not enter the process chamber 201 but are exhausted from the first exhaust system.

First Process Chamber Exhaust Process S206

After a predetermined time has elapsed, while the exhaust pump 224 of the second exhaust system is continuously operated, an opening degree of the APC valve 223 and an opening degree of the valve 236b are adjusted such that an exhaust conductance in the process space from the second exhaust system is set to be higher than an exhaust conductance from the first exhaust system via the shower head 230. Thus, the flow of gases toward the second exhaust system via the process chamber 201 is formed. Accordingly, the inert gas supplied into the buffer chamber 232 may be supplied to the substrate effectively, and the efficiency of removing gases remaining on the substrate increases.

The inert gas supplied in a process chamber exhaust process removes the element Si, which has not combined with the wafer 200 in the first process gas supply process S202, from the wafer 200. Also, the valve 236b is opened, and the pressure adjuster 237 and the vacuum pump 236d are controlled to remove BTBAS gas remaining in the shower head 230. After a predetermined time has elapsed, the valve 243d is closed to stop the supply of the inert gas, and the valve 236b is closed to cut off a space between the shower head 230 and the vacuum pump 236d.

More preferably, after a predetermined time has elapsed, the valve 236b is closed off while continuously operating the exhaust pump 224 of the second exhaust system. In this case, since the flow of gases toward the second exhaust system via the process chamber 201 is not affected by the first exhaust system, the inert gas may be supplied to the substrate more effectively, and efficiency of removing gases remaining on the substrate further increases.

After the shower head exhaust process S204, the process chamber exhaust process S206 is continuously performed to obtain the following effects. That is, since residue is removed from the buffer chamber 232 in the shower head exhaust process S204, even if gases flow over the wafer 200 in the process chamber exhaust process S206, the remnant gas may be prevented from being adhered to the substrate.

Second Process Gas Supply Process S208

After the first process chamber exhaust process S206, the valve 244d is opened, and oxygen gas is supplied via the gas introduction port 241, the buffer chamber 232 and the plurality of through holes 234a into the process chamber 201. Since the oxygen gas is supplied via the buffer chamber 232 and the through holes 234a into the process chamber 201, the oxygen gas may be uniformly supplied to the substrate. Thus, a film thickness may be uniformized.

In this case, the MFC 244c is adjusted such that oxygen gas has a predetermined flow rate. Also, a supply flow rate of the oxygen gas is in the range of, for example, 100 sccm to 5000 sccm. N2 gas may be supplied as a carrier gas from the second inert gas supply system along with the oxygen gas. Also, the inner pressure of the process container 202 is set to a predetermined pressure by appropriately adjusting an opening degree of the APC valve 223.

In this case, the valve 236b which is the opening/closing valve and the vacuum pump 236d are controlled such that an exhaust conductance in the buffer chamber 232 from the first exhaust system is set to be higher than a conductance of the exhaust pump 224 via the process chamber 201. Thus, the flow of gases from the center of the buffer chamber 232 toward the shower-head exhaust hole 231b is formed. As a result, gases adhered to the wall of the buffer chamber 232 or gases floating in the buffer space do not enter the process chamber 201 but are exhausted from the first exhaust system.

The plasma-state oxygen gas is supplied onto the wafer 200. The previously formed silicon-containing layer is modified by plasma generated from the oxygen gas to form, for example, a layer containing the element Si and the element O, on the wafer 200.

A modified layer is formed to have a predetermined thickness, a predetermined distribution, and a predetermined depth to which a predetermined element O intrudes into the silicon-containing layer, according to, for example, an inner pressure of the process container 202, a flow rate of the oxygen gas, a temperature of the substrate placing table 212, and a power supply state of a plasma generating unit 206.

After a predetermined time has elapsed, the valve 244d is closed off, and the supply of oxygen gas is stopped.

Second Shower Head Exhaust Process S210

After the supply of oxygen gas is stopped, the valve 236b is opened to exhaust the atmosphere of the shower head 230. Specifically, the atmosphere of the buffer chamber 232 is exhausted. In this case, the vacuum pump 236d is previously operated. The shower head exhaust process S210 will be described in detail below.

The valve 236b which is the opening/closing valve and the vacuum pump 236d are controlled such that an exhaust conductance in the buffer chamber 232 from the first exhaust system is set to be higher than a conductance of the exhaust pump 224 via the process chamber 201. Thus, the flow of gases from the center of the buffer chamber 232 toward the shower-head exhaust hole 231b is formed. As a result, gases adhered to the wall of the buffer chamber 232 or gases floating in the buffer space do not enter the process chamber 201 but are exhausted from the first exhaust system.

Second Process Chamber Exhaust Process S212

After a predetermined time has elapsed, while the exhaust pump 224 of the second exhaust system is continuously operated, an opening degree of the APC valve 223 and an opening degree of the valve 236b are adjusted such that an exhaust conductance in the process space from the second exhaust system is set to be higher than an exhaust conductance from the first exhaust system via the shower head 230. Thus, the flow of gases toward the second exhaust system via the process chamber 201 is formed. Accordingly, the inert gas supplied into the buffer chamber 232 may be supplied to the substrate effectively, and the efficiency of removing gases remaining on the substrate increases.

The inert gas supplied in the process chamber exhaust process removes the element Si, which has not combined with the wafer 200 in the first process gas supply process S202, from the wafer 200. Also, the valve 236b is opened, and the pressure adjuster 237 and the vacuum pump 236d are controlled to remove oxygen gas remaining in the shower head 230. After a predetermined time has elapsed, the valve 243d is closed to stop the supply of the inert gas, and the valve 236b is closed to cut off a space between the shower head 230 and the vacuum pump 236d.

More preferably, after a predetermined time has elapsed, the valve 236b is closed off while continuously operating the exhaust pump 224 of the second exhaust system. In this case, since the flow of the remnant gas of the buffer chamber 232 or the supplied inert gas toward the second exhaust system via the process chamber 201 is not affected by the first exhaust system, the inert gas may be supplied to the substrate more effectively, and efficiency of removing the remnant gas, which has not completely reacted with a first gas, from the substrate further increases.

After the shower head exhaust process S204, the process chamber exhaust process S206 is continuously performed to obtain the following effects. That is, since residue is removed from the buffer chamber 232 in the shower head exhaust process S204, even if gases flow over the wafer 200 in the process chamber exhaust process S206, the remnant gas may be prevented from being adhered to the substrate.

Determining Process S214

The controller 260 determines whether or not one cycle has been performed a predetermined number of times.

When the one cycle has not been performed the predetermined number of times (in the case of No in step S214), a cycle including the first process gas supply process S202, the first shower head exhaust process S204, the first process chamber exhaust process S206, the second process gas supply process S208, the second shower head exhaust process S210, and the second process chamber exhaust process S212 is repeated. When the one cycle has been performed the predetermined number of times (in the case of Yes in step S214), the thin film forming process S104 ends.

Next, the first shower head exhaust process S204 will be described in detail with reference to FIG. 5. Since the second shower head exhaust process S210 is generally the same as the first shower head exhaust process S204, partial descriptions thereof are omitted.

However, in the apparatus according to the present embodiment, since a first gas and a second gas are supplied via the shower head 230 into the process chamber 201, when any one gas remains in the buffer chamber 232, the gas reacts in the buffer chamber 232. Byproducts are generated due to the reaction of the gas, and it is expected that the byproducts will be adhered to the wall of the buffer chamber 232. When the generated byproducts are delaminated due to stress caused by an increase in the thickness of a deposited film and adhered to the wafer 200, the generated byproducts may adversely affect characteristics of the substrate. Therefore, it is necessary to reliably exhaust the adhered byproducts or remnant gases.

In addition, a gas stay region exists in the buffer chamber 232. For example, there is an angular space, such as a region 232a, formed between the lid 231 and a flange of the dispersion plate 234. Since the angular space is hardly affected by the flow of gases formed in a path leading from the hole 231a via the gas guide 235 to the shower-head exhaust hole 231b, gases may stay and accumulate more easily than in other portions. Also, as shown in FIG. 2, a gap occurs between respective constitutional elements according to a processing precision, and gases flow into the gap according to a size of the gap. Thus, the gases may easily remain in the gap, and reaction products and byproducts may be easily generated due to a reaction of remnant gases. Although the generated reaction products, the byproducts and the remnant gases are sometimes adhered to a wall of the stay region 232a, it is difficult to remove adhered materials only by supplying a purge gas because gases stay between the flow of gases and the adhered materials. Hereinafter, adhered materials of the generated reaction products, the byproducts and the remnant gases will be referred to as buffer-chamber adhered materials.

Therefore, in the present embodiment, a method of removing the remnant gases or byproducts more effectively even in a gas stay region will be described. Hereinafter, a shower head exhaust process will be described in detail with reference to FIG. 5.

First Exhaust Process S302

After the valve 243d is closed off in the first process gas supply process S202 [in the second shower head exhaust process S212, after the valve 244d is closed off in the second process gas supply process S208], while the valve 245d of the third gas supply system is closed off by opening the valve 236b, the atmosphere of the buffer chamber 232 is exhausted. In this case, the opening degree of the valve 236b is adjusted such that a conductance of the first exhaust system including the valve 236b is set to be higher than a conductance exhausted through the plurality of through holes 234a.

When the atmosphere of the buffer chamber 232 is exhausted as described above, the flow of gases from the hole 231a to the shower-head exhaust hole 231b is not formed. Thus, remnant gases may be removed not only from the center of the buffer chamber 232 but also from a stay region, such as an angular portion.

Furthermore, an inert gas may be supplied by opening the valve 245d. In this case, the inert gas is supplied in such an amount as to remove the remnant gases from the stay region. In this case, the atmosphere of the buffer chamber 232 is exhausted in a manner that an inner pressure of the buffer chamber 232 is sharply reduced and set to be lower than a pressure P1 in the first process gas supply process S202 [pressure in the second process gas supply process S208 in the case of the second shower head exhaust process S210].

Purge Process S304

After a predetermined time has elapsed, when the inner pressure of the buffer chamber 232 reaches a desired pressure P2, the valve 245d of the third gas supply system is opened while maintaining the opening degree of the valve 236b. Thus, an inert gas is supplied as a purge gas into the buffer chamber 232, and the inner pressure of the buffer chamber 232 is increased to a pressure P3 (e.g., atmospheric pressure) much higher than the pressure P2.

Since gases do not stay around a wall to which buffer-chamber adhered materials are adhered, the supplied inert gas may attack the buffer-chamber adhered materials. Also, delamination of the buffer-chamber adhered materials may be promoted due to a transition from the pressure P2 to the pressure P3, that is, a large variation in pressure. Due to the variation in pressure, the buffer-chamber adhered materials are delaminated from the wall of the buffer chamber 232. Also, the buffer-chamber adhered materials are discharged out of the buffer chamber 232 forcibly and efficiently due to a purge process.

The purge gas is supplied under an atmospheric pressure also for the following reasons. When the inside of the buffer chamber 232 is purged in an atmospheric-pressure state, particles are removed more effectively than when purged in a reduced-pressure state. This may be due to the fact that in the atmospheric-pressure state, molecules and atoms for carrying extraneous matters are more and energy for carrying the extraneous matters is higher than in the reduced-pressure state. Accordingly, the delaminated buffer-chamber adhered materials or remnant gases may be reliably removed.

In the purge process S304, similar to the first exhaust process S302, the opening degree of the valve 236b is maintained in a manner that a conductance of the first exhaust system including the valve 236b is set to be higher than a conductance of the second exhaust system that communicates with the process chamber 201.

In addition, when the inert gas is supplied in the first exhaust process S302, the amount of the purge gas supplied through the third gas supply system may be increased in the purge process S304 more than in the first exhaust process S302.

Second Exhaust Process S306

After a predetermined time has elapsed, the valve 245d of the third gas supply system is closed off while maintaining an opening degree of the valve 236b. In this case, similar to the first exhaust process S302 and the purge process S304, the opening degree of the valve 236b is maintained in a manner that a conductance of the first exhaust system including the valve 236b is set to be higher than a conductance of the second exhaust system that communicates with the process chamber 201.

In the above-described process, the inner pressure of the buffer chamber 232 is reduced to a pressure P4 that is much lower than the pressure P3. Delamination of the buffer-chamber adhered matters remaining in the purge process S304 is promoted due to a transition from the pressure P3 to the pressure P4, that is, a large variation in pressure.

In addition, since the flow of gases from the hole 231a via the gas guide 235 into the shower-head exhaust hole 231b is not formed, it becomes possible to remove the buffer-chamber adhered materials delaminated in the purge process S304, not only from the center of the buffer chamber 232 but also from the stay region, such as the corner portion. Also, since the conductance of the first exhaust system is controlled to be higher than the conductance of the second exhaust system, the buffer-chamber adhered materials delaminated in the purge process S304 do not fall on the wafer 200 in the process chamber 201 but may be removed.

Here, since byproducts and remnant gases may be removed due to a simple operation of controlling an opening/closing degree of the valve 245d while maintaining the opening degree of the valve 236b, processing throughput may be improved.

After a predetermined time has elapsed, the valve 236b is closed, and the valve 245d is opened. Thus, the second exhaust process S306 enters into the first process chamber exhaust process S206 [second shower head exhaust process S210 enters into the second process chamber exhaust process S212].

In addition, although the opening degree of the valve 236b is maintained in the first exhaust process S302, the purge process S304 and the second exhaust process S306, the present invention is not limited thereto. The opening degree of the valve 236b may be varied as long as a conductance of the first exhaust system remains higher than a conductance of the second exhaust system. In this case, the throughput may be reduced as compared with a case in which the opening degree of the valve 236b is maintained, but it becomes possible to control an exhaust process according to properties of gases or adhesiveness of byproducts.

In the previous embodiment, a case in which a silicon oxide film is formed on the wafer 200 using a silicon-containing gas as the first-element-containing gas and using an oxygen-containing gas as the second-element-containing gas has been described, but the present invention is not limited thereto. A high-k film, such as a hafnium oxide (HfO) film, a zirconium oxide (ZrO) film, or titanium oxide (TiO), may be formed on the wafer 200 using, for example, a hafnium (Hf)-containing gas, a zirconium (Zr)-containing gas, or a titanium (Ti)-containing gas as the first-element-containing gas.

In addition, in the previous embodiment, a case in which the oxygen-containing gas is used as the second-element-containing gas has been described, but the present invention is not limited thereto. A nitrogen-containing gas may be used as the second-element-containing gas. In this case, the nitrogen-containing gas may be nitrogen ($N_2$) gas or ammonia ($NH_3$) gas.

Furthermore, in the previous embodiment, the first gas, the second gas and a third gas are supplied via the common gas supply pipe 242 into the buffer chamber 232, but the present invention is not limited thereto. For example, every supplied gas may be connected to the shower head 230.

Although the shower-head exhaust hole 231b connected to the first exhaust system is installed in the lid 231 of the shower head 230 in the previous embodiment, the present invention is not limited thereto. For example, the shower-head exhaust hole 231b may be installed in a side surface of the buffer chamber 232.

In addition, in the previous embodiment, the first exhaust process S302, the purge process S304 and the second exhaust process S306 are performed in sequential order. However, when highly adhesive buffer-chamber adhered materials are generated, the first exhaust process S302, the purge process S304 and the second exhaust process S306 may be repeated. As a result, since stress on highly adhesive gases or buffer-chamber adhered materials further increases, it becomes easy to remove the highly adhesive buffer-chamber adhered materials.

Furthermore, after the atmosphere of the buffer chamber 232 is exhausted in the first exhaust process S302, the remnant gases or the buffer-chamber adhered materials may be removed by repeating the purge process S304 and the second exhaust process S306. A variation in pressure occurs from the purge process S304 to the second exhaust process S306 and subsequently, a variation in pressure occurs from the second exhaust process S306 to the purge process S304. Thus, stress is continuously applied to the highly adhesive gases or buffer-chamber adhered materials, so that the highly adhesive buffer-chamber adhered materials can be removed more easily.

(3) Effects of the Present Embodiment

According to the present embodiment, one or more typical effects which will be described below may be obtained.

Since the process chamber exhaust process is performed after residue is removed from the inside of the buffer chamber in the shower head exhaust process, the residue can be prevented from being adhered onto the wafer in the process chamber exhaust process.

In the process chamber exhaust process, the valve 236b is closed off while the exhaust pump 224 of the second exhaust system is continuously operated. Thus, the flow of gases via the process chamber 201 toward the second exhaust system is not affected by the first exhaust system. As a result, an inert gas may be supplied to the substrate more effectively, thereby further increasing efficiency of removing remnant gases from the substrate.

Since an atmosphere of the center of the buffer chamber or an atmosphere of the stay region may be exhausted in the first exhaust process of the shower head exhaust process, buffer-chamber adhered materials can be easily removed.

The present invention provides a substrate processing apparatus, a method of manufacturing a semiconductor device and a non-transitory computer-readable recording medium, which may inhibit generation of byproducts in a buffer space even in a single-wafer-type apparatus using the buffer space.

Supplementary Notes

The present invention is as defined by the appended claims and includes the following Supplementary notes.

Supplementary Note 1

According to one aspect of the present invention, there is provided a method of manufacturing a semiconductor device, including: (a) loading a substrate into a process chamber; (b) supplying a first-element-containing gas via a buffer chamber of a shower head to the substrate placed in the process chamber; (c) supplying a second-element-containing gas to the substrate via the buffer chamber; and (d) performing an exhaust process between the steps (b) and (c), wherein the step (d) including a buffer chamber exhaust process of exhausting the atmosphere of the buffer chamber using the first exhaust system and a process chamber exhaust process of exhausting the atmosphere of the process chamber using the second exhaust system after the buffer chamber exhaust process.

Supplementary Note 2

The method of Supplementary note 1, wherein the buffer chamber exhaust process includes a first exhaust process of exhausting the atmosphere of the buffer chamber, and a purge process of supplying an inert gas into the buffer chamber after the first exhaust process.

Supplementary Note 3

The method of Supplementary note 2, wherein the buffer chamber exhaust process further includes a second exhaust process of exhausting the atmosphere of the buffer chamber after the purge process.

Supplementary Note 4

The method of Supplementary note 3, wherein in the buffer chamber exhaust process, a combination of the first exhaust process, the purge process and the second exhaust process is repeated.

Supplementary Note 5

The method of Supplementary note 3, wherein in the buffer chamber exhaust process, the purge process and the second exhaust process are repeated after the first exhaust process is performed.

Supplementary Note 6

The method of any one of Supplementary notes 2 through 5, wherein a pressure of a buffer space is controlled to be lower in the first exhaust process than in the purge process.

Supplementary Note 7

The method of any one of Supplementary notes 2 through 6, wherein a pressure of a buffer space is controlled to be lower in the second exhaust process than in the purge process.

Supplementary Note 8

The method of Supplementary note 1, wherein a conductance of the first exhaust system configured to exhaust the atmosphere of the buffer chamber is set to be higher than a conductance of the second exhaust system configured to exhaust the atmosphere of the process chamber in the buffer chamber exhaust process, and the conductance of the second exhaust system configured to exhaust the atmosphere of the process chamber is set to be higher than the conductance of the first exhaust system configured to exhaust the atmosphere of the buffer chamber in the process chamber exhaust process.

Supplementary Note 9

The method of Supplementary note 1 or Supplementary note 2, wherein a valve of the first exhaust system configured to exhaust the atmosphere of the buffer chamber is opened in the buffer chamber exhaust process, and an opening degree of the valve is controlled to be lower in the process chamber exhaust process than in the buffer chamber exhaust process.

Supplementary Note 10

According to another aspect of the present invention, there is provided a substrate processing apparatus including: a process chamber configured to process a substrate; a shower head including a buffer chamber; a first exhaust system configured to exhaust an atmosphere of the buffer chamber; a first-element-containing gas supply system configured to supply a first-element-containing gas to the substrate via the buffer chamber; a second-element-containing gas supply system configured to supply a second-element-containing gas to the substrate via the buffer chamber; a second exhaust system configured to exhaust an atmosphere of the process chamber; and a control unit configured to control the first exhaust system, the first-element-containing gas supply system, the second-element-containing gas supply system and the second exhaust system to perform: (a) loading the substrate into the process chamber; (b) supplying the first-element-containing gas via the buffer chamber of the shower head to the substrate placed in the process chamber; (c) supplying the second-element-containing gas to the substrate via the buffer chamber, and (d) performing an exhaust process between the step (b) and the step (c), the step (d) including a buffer chamber exhaust process of exhausting the atmosphere of the buffer chamber using the first exhaust system and a process chamber exhaust process of exhausting the atmosphere of the process chamber using the second exhaust system after the buffer chamber exhaust process Supplementary Note 11

According to another aspect of the present invention, there is provided a method of manufacturing a semiconductor device, including: a process of loading a substrate into a process chamber; a first-element-containing gas supply process of supplying a first-element-containing gas via a buffer chamber of a shower head to the substrate placed in the process chamber; a second-element-containing gas supply process of supplying a second-element-containing gas to the substrate via the buffer chamber; and an exhaust process including (process A) a buffer chamber exhaust process of exhausting an atmosphere of the buffer chamber and (process B) a process chamber exhaust process of exhausting an atmosphere of the process chamber after the buffer chamber exhaust process, between the first-element-containing gas supply process and the second-element-containing gas supply process.

Supplementary Note 12

According to another aspect of the present invention, there is provided a semiconductor manufacturing apparatus including: a process chamber configured to process a substrate; a shower head disposed above the process chamber and including a buffer chamber configured to communicate with the process chamber; a first exhaust system configured to exhaust an atmosphere of the buffer chamber; a first-element-containing gas supply system configured to supply a first-element-containing gas via the buffer chamber; a second-element-containing gas supply system configured to supply a second-element-containing gas via the buffer chamber; a second exhaust system configured to exhaust an atmosphere of the process chamber; and a control unit configured to control the first exhaust system, the first-element-containing gas supply system, the second-element-containing gas supply system and the second exhaust system to perform a process of loading the substrate into the process chamber, a first-element-containing gas supply process of supplying the first-element-containing gas via the buffer chamber of the shower head to the substrate placed in the process chamber, a second-element-containing gas supply process of supplying the second-element-containing gas to the substrate via the buffer chamber, and an exhaust process including (process A) a buffer chamber exhaust process of exhausting the atmosphere of the buffer chamber and (process B) a process chamber exhaust process of exhausting the atmosphere of the process chamber after the buffer chamber exhaust process, between the first-element-containing gas supply process and the second-element-containing gas supply process.

Supplementary Note 13

According to another aspect of the present invention, there is provided a substrate processing apparatus including: a process container configured to process a substrate; a process chamber configured to form a substrate process space for processing the substrate in the process container; a substrate placing unit on which the substrate is placed; a gas supply unit including a first gas supply system including a first gas control unit configured to control supply of a first-element-containing gas and a first gas pipe into which the first-element-containing gas is injected, a second gas supply system including a second gas control unit configured to control supply of a second-element-containing gas and a second gas pipe into which the second-element-containing gas is injected, and a third gas supply system including a third gas control unit configured to control supply of an inert gas and a third gas pipe into which the inert gas is injected; a first exhaust system including a buffer space installed between the gas supply unit and the process space, a first exhaust control unit connected to a buffer chamber constituting the buffer space and configured to control the exhaust of an atmosphere of the buffer chamber, and a first exhaust pipe into which the atmosphere of the buffer chamber is injected; a second exhaust system including a second exhaust control unit connected to the process chamber and configured to control the exhaust of an atmosphere of the process chamber, and a second exhaust pipe into which the atmosphere of the process chamber is injected; and a control unit configured to control the gas supply unit, the first exhaust system and the second exhaust system to perform, with the substrate loaded into the process chamber, a first-element-containing gas supply process of supplying the first-element-containing gas via the buffer space into the process chamber, perform a second-element-containing gas supply process of supplying the second-element-containing gas via the buffer space into the process chamber, and perform an exhaust process of exhausting the buffer space of the buffer chamber and then exhausting the process space between the first-element-containing gas supply process and the second-element-containing gas supply process.

Supplementary Note 14

According to another aspect of the present invention, there is provided a method of manufacturing a semiconductor device using a semiconductor processing apparatus including: a process container configured to process a substrate; a process chamber constituting a substrate process space for processing the substrate in the process container; a substrate placing unit on which the substrate is placed; a gas supply unit including a first gas supply system including a first gas control unit configured to control supply of a first process gas and a first gas pipe into which the first process gas is injected, a second gas supply system including a second gas control unit configured to control supply of a second process gas and a second gas pipe into which the second process gas is injected, and a third gas supply system including a third gas control unit configured to control supply of an inert gas and a third gas pipe into which the inert gas is injected; a first exhaust system including a buffer space installed between the gas supply unit and the process space, a first exhaust control unit connected to a buffer chamber (shower head) constituting the buffer space and configured to control the exhaust of an atmosphere of the buffer chamber, and a first exhaust pipe into which the atmosphere of the buffer chamber is injected; and a second exhaust system including a second exhaust control unit connected to the process chamber and configured to control the exhaust of an atmosphere of the process chamber, and a second exhaust pipe into which the atmosphere of the process chamber is injected, the method including: a process of loading the substrate into the process container and placing the substrate on the substrate placing unit; a substrate processing process of forming a film having a desired thickness by repeating a first gas supply process of supplying the first process gas from the first gas supply system via the buffer chamber into the process chamber and a second gas supply process of supplying the second process gas from the second gas supply system via the buffer chamber into the process chamber while performing a removal process of removing remnant gases from the buffer space and the process space between the first gas supply process and the second gas supply process; and unloading the substrate from the process container after the substrate processing process, wherein the removal process includes a removal process A of starting removing the remnant gases from the buffer chamber to remove residue and a removal process B of starting removing the remnant gases from the process space after the removal process A.

Supplementary Note 15

The method of Supplementary note 14, wherein the removal process A includes a first exhaust process of exhausting the atmosphere of the buffer chamber and a purge process of increasing the amount of a purge gas supplied into the buffer chamber after the first exhaust process.

Supplementary Note 16

The method of Supplementary note 15, wherein the removal process A further includes a second exhaust process of exhausting the atmosphere of the buffer chamber after the purge process.

Supplementary Note 17

The method of Supplementary note 14, wherein the amount of an atmosphere exhausted by the first exhaust system is set to be larger than the amount of an atmosphere exhausted by the second exhaust system in the removal process A, and the amount of the atmosphere exhausted by the first exhaust system is set to be smaller than the amount of the atmosphere exhausted by the second exhaust system in the removal process B.

Supplementary Note 18

The method of Supplementary note 14, wherein in the removal process A, the amount of purge gas supplied into the process space is controlled to be larger than the exhausted amount of purge gas flowing into the first exhaust pipe after a desired time elapses.

Supplementary Note 19

The method of Supplementary note 14, wherein in the removal process B, a valve of the first exhaust control unit is controlled to be closed off after a desired time elapses since the removal of the remnant gases from the buffer space has started.

Supplementary Note 20

The method of Supplementary note 14, wherein the gas supply unit includes a common gas supply pipe installed between the first gas supply system, the second gas supply system, the third gas supply system and the buffer chamber and connected to the first gas supply system, the second gas supply system and the third gas supply system, wherein an atmosphere of the common gas supply pipe is controlled to be exhausted in the removal process.

What is claimed is:

1. A substrate processing apparatus comprising:
   a process chamber configured to process a substrate;
   a shower head including a buffer chamber;
   a first exhaust system configured to exhaust an atmosphere of the buffer chamber;
   a first-element-containing gas supply system configured to supply a first-element-containing gas to the substrate via the buffer chamber;
   a second-element-containing gas supply system configured to supply a second-element-containing gas to the substrate via the buffer chamber;
   a second exhaust system configured to exhaust an atmosphere of the process chamber; and
   a control unit configured to control the first exhaust system, the first-element-containing gas supply system, the second-element-containing gas supply system and the second exhaust system to perform: (a) loading the substrate into the process chamber; (b) supplying the first-element-containing gas via the buffer chamber of the shower head to the substrate placed in the process chamber; (c) supplying the second-element-containing gas to the substrate via the buffer chamber, and (d) performing an exhaust process between (b) and (c), wherein (d)

includes a buffer chamber exhaust process of exhausting the atmosphere of the buffer chamber using the first exhaust system and a process chamber exhaust process of exhausting the atmosphere of the process chamber using the second exhaust system after the buffer chamber exhaust process.

2. The substrate processing apparatus according to claim 1, further comprising an inert gas supply system configured to supply an inert gas to the substrate via the buffer chamber,
wherein the control unit is configured to control the first exhaust system and the inert gas supply system to perform a first exhaust process of exhausting the atmosphere of the buffer chamber and a purge process of supplying the inert gas into the buffer chamber after the first exhaust process in the buffer chamber exhaust process.

3. The substrate processing apparatus according to claim 2, wherein the control unit is configured to control the first exhaust system and the inert gas supply system to perform a second exhaust process of exhausting the atmosphere of the buffer chamber after the purge process.

4. The substrate processing apparatus according to claim 3, wherein the control unit is configured to control the first exhaust system and the inert gas supply system to repeat a combination of the first exhaust process, the purge process and the second exhaust process in the buffer chamber exhaust process.

5. The substrate processing apparatus according to claim 3, wherein the control unit is configured to control the first exhaust system and the inert gas supply system to repeat the purge process and the second exhaust process after the first exhaust process in the buffer chamber exhaust process.

6. The substrate processing apparatus according to claim 3, wherein the control unit is configured to control the first exhaust system and the inert gas supply system in a manner that a pressure of a buffer space in the second exhaust process is lower than that of the buffer space in the purge process.

7. The substrate processing apparatus according to claim 2, wherein the control unit is configured to control the first exhaust system and the inert gas supply system in a manner that a pressure of a buffer space in the first exhaust process is lower than that of the buffer space in the purge process.

8. The substrate processing apparatus according to claim 7, wherein the control unit is configured to control the first exhaust system and the inert gas supply system to perform a second exhaust process of exhausting the atmosphere of the buffer chamber after the purge process.

9. The substrate processing apparatus according to claim 8, wherein the control unit is configured to control the first exhaust system and the inert gas supply system such that a pressure of the buffer space in the second exhaust process is lower than that of the buffer space in the purge process.

10. The substrate processing apparatus according to claim 1, wherein the control unit is configured to control the first exhaust system and the second exhaust system in manner that that a conductance of the first exhaust system configured to exhaust the atmosphere of the buffer chamber is higher than that of the second exhaust system configured to exhaust the atmosphere of the process chamber in the buffer chamber exhaust process, and the conductance of the second exhaust system configured to exhaust the atmosphere of the process chamber is higher than the conductance of the first exhaust system configured to exhaust the atmosphere of the buffer chamber in the process chamber exhaust process.

11. The substrate processing apparatus according to claim 10, further comprising an inert gas supply system configured to supply an inert gas to the substrate via the buffer chamber,
wherein the control unit is configured to control the first exhaust system and the inert gas supply system to perform a first exhaust process of exhausting the atmosphere of the buffer chamber and a purge process of supplying the inert gas into the buffer chamber after the first exhaust process in the buffer chamber exhaust process.

12. The substrate processing apparatus according to claim 11, wherein the control unit is configured to control the first exhaust system and the inert gas supply system to perform a second exhaust process of exhausting the atmosphere of the buffer chamber after the purge process.

13. The substrate processing apparatus according to claim 10, wherein the control unit is configured to control the first exhaust system and the inert gas supply system in a manner that a pressure of a buffer space in the first exhaust process is lower than that of the buffer space in the purge process.

14. The substrate processing apparatus according to claim 13, wherein the control unit is configured to control the first exhaust system and the inert gas supply system to perform a second exhaust process of exhausting the atmosphere of the buffer chamber after the purge process.

15. The substrate processing apparatus according to claim 14, wherein the control unit is configured to control the first exhaust system and the inert gas supply system in a manner that a pressure of the buffer space in the second exhaust process is lower than that of the buffer space in the purge process.

16. The substrate processing apparatus according to claim 1, wherein the control unit is configured to open a valve of the first exhaust system configured to exhaust the atmosphere of the buffer chamber in the buffer chamber exhaust process, and configured to control the first exhaust system in a manner that an opening degree of the valve of the first exhaust system in the process chamber exhaust process is less than that of the valve of the first exhaust system in the buffer chamber exhaust process.

17. The substrate processing apparatus according to claim 16, wherein the control unit is configured to control the first exhaust system and the second exhaust system in a manner that a conductance of the first exhaust system configured to exhaust the atmosphere of the buffer chamber is higher than that of the second exhaust system configured to exhaust the atmosphere of the process chamber in the buffer chamber exhaust process, and the conductance of the second exhaust system configured to exhaust the atmosphere of the process chamber is higher than that of the first exhaust system configured to exhaust the atmosphere of the buffer chamber in the process chamber exhaust process.

* * * * *